United States Patent
De Beijer et al.

(10) Patent No.: US 9,536,760 B2
(45) Date of Patent: Jan. 3, 2017

(54) SEMICONDUCTOR DIE ENCAPSULATION OR CARRIER-MOUNTING METHOD, AND CORRESPONDING SEMICONDUCTOR DIE ENCAPSULATION OR CARRIER-MOUNTING APPARATUS

(71) Applicant: BOSCHMAN TECHNOLOGIES BV, Duiven (NL)

(72) Inventors: Johannes Cornelis De Beijer, Duiven (NL); Michiel Hendrikus Antonius Wilhelmus Rutten, Duiven (NL); Ger Huizing, Duiven (NL); Mike Louis Theodoor Hoedemaker, Duiven (NL)

(73) Assignee: BOSCHMAN TECHNOLOGIES BV, Duiven (NL)

( * ) Notice: Subject to any disclaimer, the term of this patent is extended or adjusted under 35 U.S.C. 154(b) by 0 days.

(21) Appl. No.: 14/766,161

(22) PCT Filed: Feb. 5, 2014

(86) PCT No.: PCT/NL2014/050069
§ 371 (c)(1),
(2) Date: Aug. 6, 2015

(87) PCT Pub. No.: WO2014/123413
PCT Pub. Date: Aug. 14, 2014

(65) Prior Publication Data
US 2015/0371880 A1 Dec. 24, 2015

(30) Foreign Application Priority Data

Feb. 6, 2013 (NL) ...................................... 2010252

(51) Int. Cl.
*H01L 21/67* (2006.01)
*H01L 21/56* (2006.01)
(Continued)

(52) U.S. Cl.
CPC ... *H01L 21/67126* (2013.01); *B29C 45/14655* (2013.01); *B29C 45/82* (2013.01);
(Continued)

(58) Field of Classification Search
CPC ............. H01L 21/67126; H01L 21/561; H01L 21/67092; H01L 21/67144; H01L 21/67253; H01L 22/10; H01L 23/3107; H01L 23/495; H01L 23/498; H01L 24/97; H01L 22/20; H01L 23/3164; H01L 23/291; H01L 23/293; H01L 23/28; H01L 23/295; H01L 23/296; H01L 23/298; H01L 23/3114; H01L 23/3121; H01L 23/31; B29C 45/14655; B29C 45/82; B29C 45/1406; G01R 31/26
See application file for complete search history.

(56) References Cited

U.S. PATENT DOCUMENTS

2013/0028998 A1* 1/2013 Maekawa ............. H01L 21/565
425/129.1

FOREIGN PATENT DOCUMENTS

EP 1 939 926 A1 7/2008
GB 2253182 * 2/1992 ............. B29C 45/02
(Continued)

OTHER PUBLICATIONS

International Search Report, dated Apr. 10, 2014, from corresponding PCT application.

*Primary Examiner* — Julio J Maldonado
*Assistant Examiner* — Farun Lu
(74) *Attorney, Agent, or Firm* — Young & Thompson (57) ABSTRACT

A semiconductor die encapsulation or carrier-mounting method and apparatus for manufacturing a semiconductor product, wherein a first tool part for holding multiple semiconductor dies is provided and the semiconductor dies are (Continued)

placed on the first tool part, one of the first and a second tool part including displaceable insert members applying a pressure by each displaceable insert member on a surface area of the semiconductor die, and the first and second tool parts are brought together to define a space between the first and second tool parts with the semiconductor products being arranged within the space. The pressure applied by the displaceable insert members is monitored and regulated to a predetermined pressure, and subsequently, the first and second tool parts are separated and the processed semiconductor dies removed.

23 Claims, 7 Drawing Sheets

(51) Int. Cl.
    *B29C 45/14*     (2006.01)
    *B29C 45/82*     (2006.01)
    *H01L 21/66*     (2006.01)
    *H01L 23/31*     (2006.01)
    *H01L 23/495*     (2006.01)
    *H01L 23/498*     (2006.01)
    *H01L 23/00*     (2006.01)
    *B29C 45/26*     (2006.01)

(52) U.S. Cl.
    CPC ...... *H01L 21/561* (2013.01); *H01L 21/67092* (2013.01); *H01L 21/67144* (2013.01); *H01L 21/67253* (2013.01); *H01L 22/10* (2013.01); *H01L 23/3107* (2013.01); *H01L 23/495* (2013.01); *H01L 23/498* (2013.01); *H01L 24/97* (2013.01); *B29C 45/14065* (2013.01); *B29C 45/14336* (2013.01); *B29C 45/2628* (2013.01); *B29C 2045/822* (2013.01)

(56) References Cited

FOREIGN PATENT DOCUMENTS

GB     2 253 182 A     9/1992
WO     2007/150012 A2     12/2007

* cited by examiner

SEMICONDUCTOR DIE ENCAPSULATION OR CARRIER-MOUNTING METHOD, AND CORRESPONDING SEMICONDUCTOR DIE ENCAPSULATION OR CARRIER-MOUNTING APPARATUS

FIELD OF THE INVENTION

The invention relates to a semiconductor die encapsulation or carrier-mounting method comprising the steps of providing a first tool part constructed and arranged for holding multiple semiconductor dies at positions associated with the first tool part and providing semiconductor dies to said positions associated with the first tool part; providing a second tool part with members constructed and arranged to apply a pressure by a member on a surface area of a semiconductor die provided on the first tool part; bringing together the first and second tool parts such as to define a space between the first and second tool parts, the semiconductor dies being arranged in the space; having a member apply a pressure onto the surface area of a semiconductor die; separating the first and second tool parts; and removing the processed semiconductor product. The invention further relates to a corresponding semiconductor die encapsulation or carrier-mounting processing apparatus.

BACKGROUND OF THE INVENTION

The method can, for instance, be a semiconductor die encapsulation method that further comprises introducing a material in a liquid state into the space after having the member apply a pressure onto the predetermined surface area of the semiconductor die; and letting the material solidify from the liquid state into a solid state. The method may, for instance, further be a semiconductor die carrier-mounting method that further comprises providing the semiconductor die onto a carrier with a bonding material in between carrier and semiconductor die; providing the carrier with the semiconductor die onto the first tool part in the step of providing the semiconductor die on the first tool part; and allowing the bonding material to harden. Such methods, and corresponding apparatuses, are known as such, and are generally concerned with providing a pressure on a surface of a semiconductor die with a member. In the case of the semiconductor die encapsulation method a semiconductor product is encapsulated by some material protecting the semiconductor die.

The semiconductor die itself is manufactured through other methods on a wafer, for instance, a silicon wafer, and will generally contain integrated circuits (ICs). Other semiconductor dies may be manufactured on a glass substrate. Examples of such semiconductor dies are chips, sensors, power ICs, flip chips MEMS, contact pads (for instance, for solar) passives, discrete, LEDs, microfluidics, biosensors, etcetera, and combinations thereof. Such semiconductor products will for the purpose of the present description generally be referred to as a semiconductor die. A die may be separated from a finished semiconductor wafer. A bare die may be provided on the first tool part, but the die can also be arranged on a carrier to provide the semiconductor die. Contacts pads of the die may have to remain open and should thus not be encapsulated. For a sensor a sensor area is generally to remain open, and for a power IC a window on its heat sink may have to remain open to allow good thermal contact of the heat sink connected to the power IC with the environment. Multiple open areas or windows can be required for die when encapsulating. To create the open windows in the encapsulation a member is brought into contact with the semiconductor die when the semiconductor product is held in the space between the first and second tool parts, which are first and second mould insert members in this encapsulation method. The member or insert member (also referred to as insert) may be fixedly attached to the second tool part, or may be spring loaded for exerting pressure in known methods. In both instances the height of the surface of the die (the semiconductor product) to be brought into contact with the insert should be well known to provide a good contact. A die surface that is 'too high' will result in a too high pressure exerted by the insert member on the die, which can damage the die. A die surface that is 'too low' will result in not enough pressure exerted by the insert member on the surface, which will cause in flash and bleed of the encapsulation material onto the open window. Such height restrictions severely limit the process window of the encapsulation process.

Furthermore, the force exerted by the (displaceable) insert member will be a constant but may be counteracted by encapsulation material within the space if the insert member is wider than the die. Encapsulation material will be provided under part of the insert member which 'overshoots' the die and cause another force counteracting the force and thus the pressure exerted by the insert member on the die. The configuration of the die within the space in between the first and second mould member may further be such that encapsulation material comes under the die so that a force is exerted on the die which is opposite the force exerted by the insert member. As a result the total pressure exerted on the die will increase, which may damage the die. Such phenomena will even further limit the process window of the encapsulation process.

In the case of the semiconductor die carrier-mounting method a pressure is to be exerted on the semiconductor die and the bonding material to provide a good bond between the semiconductor die and the carrier while the bonding material hardens. The method is also being referred to as a sintering method. Also in this method a height variation in the surfaces of the dies to be brought into contact with the insert member will generally be present, which will result in pressures being exerted on the die which are too high or too low for the purpose. A too high pressure can again cause damage to the die and a too low pressure can result in insufficient bonding and/or contact between die and carrier. Also in this case the process window is severely limited by the height restrictions on the semiconductor product.

SUMMARY OF THE INVENTION

It is an object of the invention to provide a semiconductor die encapsulation or carrier-mounting method that provides a process window that is not limited by height variations in the surface of the semiconductor die which is to be contacted by an insert member.

It is another or alternative object of the invention to provide a semiconductor die encapsulation or carrier mounting method that can provide a well-defined pressure onto the semiconductor die, at least largely independent of process variables.

It is yet another or alternative object of the invention to provide a reliable method and apparatus for keeping an exposure area clean in an encapsulation process, especially for products showing a large variation in height.

It is yet another or alternative object of the invention to provide a method and apparatus of which a pressure exerted by an insert member onto a surface of a semiconductor die at the start of process can be set to a low value.

It is yet another or alternative object of the invention to provide a method and apparatus that allows semiconductor dies to be provided with high tolerances on height variations on a supporting substrate (lead frame) or tool part for further processing to reduce costs.

One or more of the objects are achieved by a semiconductor die encapsulation or carrier-mounting method comprising the steps of providing a first tool part constructed and arranged for holding multiple (more than one) semiconductor dies at positions associated with the first tool part;

providing semiconductor dies to said positions associated with the first tool part;

providing a second tool part, one of the first and second tool parts comprising displaceable insert members constructed and arranged to allow applying a pressure by each displaceable insert member onto a surface area of a semiconductor die provided on the first tool part, each of said positions associated with the first tool part being associated with one or more displaceable insert members;

bringing together the first and second tool parts such as to define a space between the first and second tool parts, the semiconductor dies being arranged in the space;

having the displaceable insert member apply a force onto said surface area of the semiconductor product;

monitoring the force applied by each displaceable insert member;

regulating the force applied by each displaceable insert member to a predetermined force;

separating the first and second tool parts; and removing the processed semiconductor dies.

In an embodiment the force applied by each displaceable insert member is regulated under PID control provided with a set point for the predetermined force, which proves an efficient method for setting and controlling the force by the insert.

In a preferred embodiment the force applied by each displaceable insert member is provided by fluid pressure in an expandable arrangement acting on each displaceable insert member, in an embodiment the same fluid pressure acts on each displaceable insert member. The air pressure can be accurately, fast and efficiently be controlled for very well regulation of the pressure by the insert member. Advantageously, the expandable arrangement comprises at least one of a piston, a bellows and a membrane, which proved to be reliable ways of providing an expandable insert member.

In another preferred embodiment a displaceable insert member is tilted such that a contacting surface of the displaceable insert member is aligned parallel with a surface of the semiconductor die on which a force is to be exerted by the displaceable insert member. This allows the insert members to adapt to semiconductor dies that have been provided on the first tool member in a tilted fashion, or to adapt to surfaces of semiconductor dies that are tilted due to another reason. Such adaption to a tilted surface of a semiconductor die allows to provide an even pressure across the surface. It allows adapting to dies having a large variation in tilt. Otherwise a too high pressure will be exerted at "higher" part of the surface, causing damage to the semiconductor die, and a too low pressure at a "lower" part of the semiconductor die surface. In an embodiment the method further comprises the step of providing a plastic film in between semiconductor dies and displaceable insert members. The plastic film improves in keeping the surface areas of the semiconductor dies clean.

In another embodiment a deformable member of the expandable arrangement acts on at least one displaceable insert member, which allows activating multiple inserts by one expandable arrangement in certain applications. In practice it allows very fast adapting the method to processing another arrangement of semiconductor products. The deformable member efficiently comprises a flexible material, such as a silicone material.

In yet another embodiment a plate of the expandable arrangement acts and exerts a substantially equal force on two or three displaceable insert members by tilting around a central point, which can prove efficient when handling an arrangement of small semiconductor products.

The invention further relates to a semiconductor die encapsulation method further comprising the steps of introducing an encapsulation material in a liquid state into the space after having the displaceable insert members apply a force onto said surface area of the semiconductor dies;

monitoring a pressure in the space;

regulating the force applied by the displaceable insert member to the predetermined force that is dependent on the pressure in the space; and letting the encapsulation material solidify from the liquid state into a solid state.

The invention yet further relates to a semiconductor die carrier-mounting method further comprising the steps of providing the semiconductor dies onto a carrier with a bonding material in between carrier and semiconductor dies;

providing the carrier with the semiconductor dies onto the first tool part in the step of providing the semiconductor dies on the first tool part; and allowing the bonding material to cure while regulating the force applied by the displaceable insert members to the predetermined force.

In another aspect the invention relates to a corresponding semiconductor die encapsulation or carrier-mounting apparatus comprising a first tool part constructed and arranged for holding multiple (more than one) semiconductor dies;

a second tool part, the first and second tool parts being arranged such as to allow the first and second tool parts to be brought together so as to define a space between the first and second tool parts, the semiconductor dies being arranged in the space when held on the first tool part, and one of the first and second tool parts comprising displaceable insert members constructed and arranged to allow applying a force by each displaceable insert member onto a surface area of each semiconductor die provided on the first tool part, each of said positions associated with the first tool part being associated with one or more displaceable insert members;

an insert member force monitoring arrangement constructed and arranged for monitoring the force applied by each displaceable insert member; and a regulating arrangement constructed and arranged for regulating the force applied by each displaceable insert member to a predetermined force.

In an embodiment the semiconductor die encapsulating apparatus comprises a filling arrangement constructed and arranged for introducing an encapsulating material in a liquid state into the space; and a space pressure monitoring arrangement constructed and arranged for monitoring the pressure in the space.

In yet another embodiment the apparatus comprises a force controller configured to regulate the force applied by the displaceable insert member under PID control provided with a set point for the predetermined force.

In yet another embodiment the apparatus comprises an expandable arrangement acting on the displaceable insert member, and a fluid flow arrangement configured for providing a fluid pressure in the expandable arrangement such as to provide the force applied by the displaceable insert member. The expandable arrangement can comprises at least one of a piston, a bellows and a membrane.

In a further embodiment the displaceable insert members are constructed and arranged to be tiltable such that a contacting surface of each displaceable insert member is aligned parallel with a surface of the semiconductor product on which a pressure is exerted by the displaceable insert member.

In an embodiment the expandable arrangement comprises a deformable member constructed and arranged such as to act on at least one displaceable insert member. The deformable member may comprise a silicone material.

In another embodiment the expandable arrangement comprises a plate constructed and arranged such as to act on two or three displaceable insert members and the plate being tiltable around a central point such as to exert a substantially equal force on each insert member.

The invention also relates to a semiconductor product manufactured using the semiconductor die encapsulation or carrier-mounting processing method according to the method according to the invention.

WO 2007/150012 A and EP 1 939 926 A may disclose apparatuses for bonding semiconductor substrates. However, these disclosures relate to the bonding to one another of two single semiconductor wafers, which are very large area substrates. The problems associated with and solutions suggested by these publications on semiconductor wafers is quite different and unrelated to the problems associated with and solutions provided by the methods and apparatuses for die encapsulation or carrier-mounting according to the invention.

BRIEF DESCRIPTION OF THE DRAWINGS

Further features and advantages of the invention will become apparent from the description of the invention by way of non-limiting and non-exclusive embodiments. These embodiments are not to be construed as limiting the scope of protection. Various other embodiments can be envisioned within the scope of the invention. Embodiments of the invention will be described with reference to the accompanying drawings, in which like or same reference symbols denote like, same or corresponding parts, and in which.

DETAILED DESCRIPTION OF EMBODIMENTS

Figure 1:
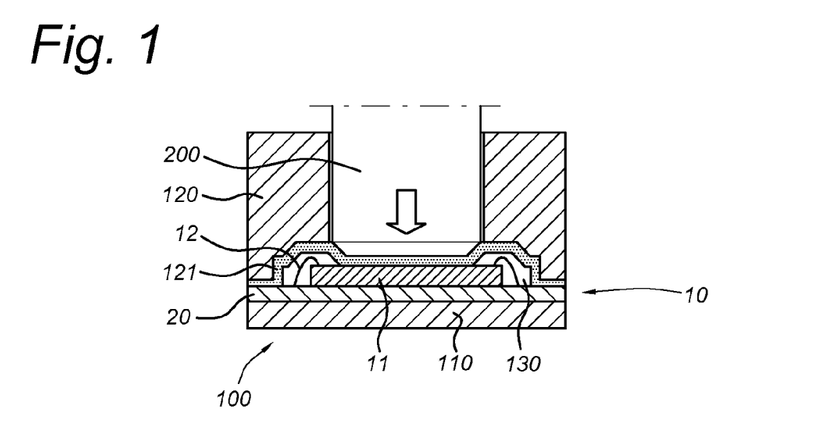
FIG. 1 shows a mould having a displaceable insert member, a semiconductor die being provided in the space between first and second mould parts for encapsulation of the semiconductor die.

A mould 100 for use in an encapsulation method of semiconductors products 10 being or comprising semiconductor dies is shown in FIG. 1. The figure shows the semiconductor product or die being provided in a space 130 between a first tool (mould) part 110 and a second tool (mould) part 120. In the example shown the semiconductor carrier-die product 10 comprises a die 11 arranged on a carrier 20, and contact wires 12 have been provided in between die 11 and electrical contacts (not shown) on the carrier. An encapsulation material in a liquid state is to be provided in the open space 130 between the mould parts 110 and 120, carrier 20 and semiconductor product 10 for encapsulation of the semiconductor product, which is of die, electrical wires and part of the carrier. After introduction of the liquid encapsulation material it is allowed to solidify to provide the final encapsulate of the semiconductor product and/or die. An encapsulation method and corresponding apparatus is known as such and not further disclosed. FIG. 1 further shows a film 121 that has been provided in between second mould (tool) part 120 and semiconductor product and carrier to prevent sticking of the encapsulation material to the mould. A film can be applied to one or both tool parts 110, 120 before the semiconductor product is provided. The film preferably is stretchable film, such as a Teflon film.

The semiconductor product may comprise various kinds of products, which are generally manufactured using semiconductor manufacturing technologies. It can comprise chips, power ICs, sensors, MEMS, LEDs, etcetera and combinations thereof. The semiconductor product can be a bare die, but can also be a die provided on a substrate or carrier to provide the semiconductor product. Generally, the semiconductor product comprises a die that is manufactured in and separated out of a wafer or the like using semiconductor manufacturing technologies, such as, for instance, implantation, chemical vapor deposition, lithographic projection, etcetera.

FIG. 1 further shows an insert member 200 provided on the second tool part 120. The insert member is shown in contact with the die 11 of the semiconductor product 10 with the film 121 in between, which serves to keep an open area or window on the semiconductor product. The insert member exerts pressure onto the semiconductor product, which pressure is to be carefully selected. A pressure that is too high can damage the semiconductor product and a pressure that is too low can result in encapsulation material coming in between semiconductor product and insert member (film), which results in so-called flash and bleed.

Figure 2A:
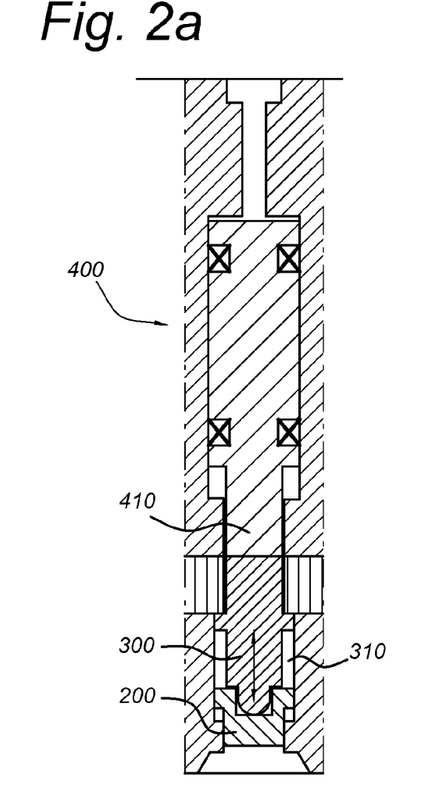
FIGS. 2a and 2b show details of the displaceable insert member of FIG. 1 in retracted and inserted positions, respectively.

The insert member (or shortly referred to as insert) is displaceable in a direction that is substantially perpendicular to the surface of the semiconductor die contacted by the insert 200, which is a vertical direction in FIG. 1, and allows varying the force and pressure (force per unit surface area) exerted by the insert. FIG. 2a shows a position of the insert

Figure 2B:
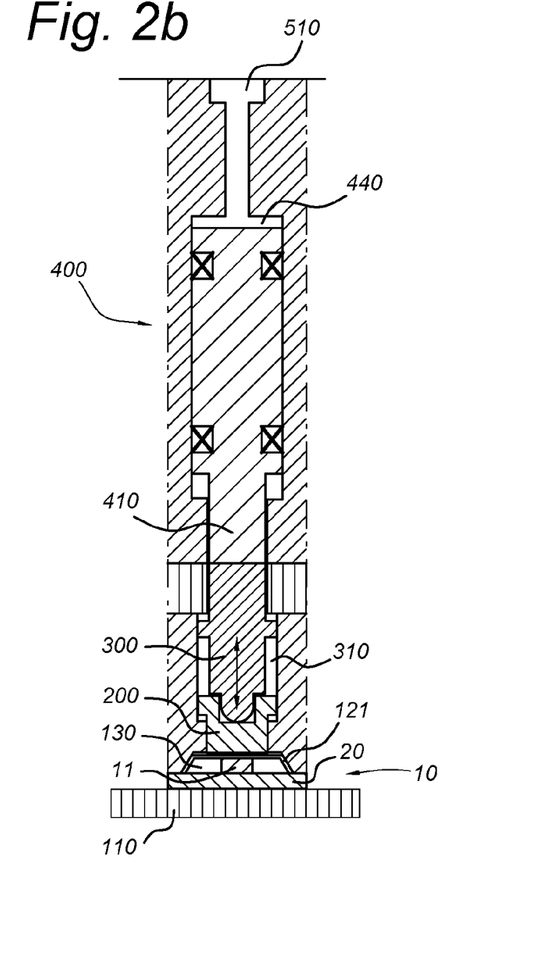

200 before first and second tool parts 110, 120 are brought together. The insert 200 is in a retracted position within the second tool part 120. FIG. 2b shows the first and second tool parts brought together as shown in FIG. 1. The insert 200 is in contact with the semiconductor die 11 with a film 121 in between. One can arrive from the situation of FIG. 2a to the situation of FIG. 2b in basically two ways. One way concerns first bringing the first and second tool parts together and subsequently bringing the insert in contact with the semiconductor die by displacing the insert with respect to the second tool part. The second way concerns first displacing the insert with respect to the second tool part so that it projects out of the second tool part. Subsequently, the first and second tool part are brought together. The insert will come into contact earlier with the semiconductor die than first and second tool parts come into contact. The insert will therefore be moved back into the second tool part when first and second tool parts are brought into contact.

The configuration is further such that the displaceable insert member 200 can make a tilting movement such that the surface of the insert that is to contact a surface of the semiconductor die becomes aligned with that surface of the semiconductor die. For that purpose an intermediate member 300 is provided with a convex, rounded and/or pointed end in contact with the insert member, which allows tilting of the insert 200 about the point of contact with the intermediate member 300. Movement of insert 200 and intermediate member 300 is confined by a cavity 310 provided by second tool part 120 and intermediate plate 320, as is shown in FIG. 4.

Figure 3:
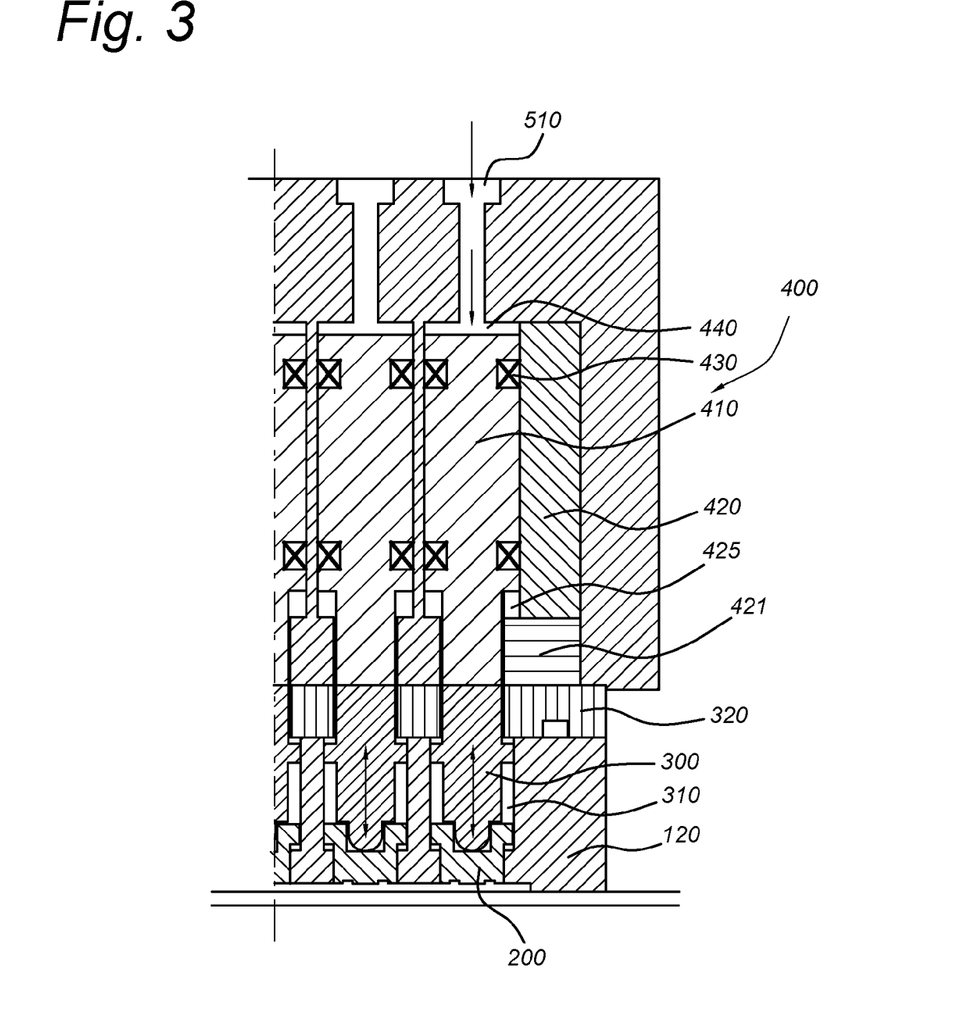
FIG. 3 shows details of the insert member of FIGS. 1 and 2 together with an expandable member acting on the displaceable insert member.

Displacement of the intermediate member 300 is driven by an expandable arrangement 400, which is further shown in FIG. 3. The expandable arrangement comprises a piston 410 that can move within a piston block 420. Seals taking the form of X-rings 430 are provided in between piston 410 and piston block 420. A fluid chamber 440 is arranged above the piston within the piston block for applying a fluid pressure onto the piston. The fluid pressure is via the intermediate member 300 exerted on the insert 200 and thus on the semiconductor product 10. The fluid can be air that is supplied through fluid channel 510 of fluid flow arrangement 500 to the fluid chamber 440. The expandable arrangement may also comprise a bellows that expands or contracts as a result of a fluid pressure applied to the bellows.

FIG. 3 shows multiple displaceable insert members, each being associated with a position associated with the first tool part for positioning of a semiconductor die. The first tool part is suited to hold multiple semiconductor dies, which generally can be a few hundred semiconductor dies that might be incorporated in some larger semiconductor product. The method and corresponding apparatus allow thus a very high productivity in numbers of dies processed per shot. The surface area of the dies to be kept open by the inserts can be in the order of 0.2 to 20 millimeters square. Pressure applied by a displaceable insert can be in the order of 1 bar, for instance, 5 bar, to several tens or even hundreds of bars, for instance, 100 bar. The temperatures can range from a few tens of degrees Centigrade to a few hundreds of degrees Centigrade, for instance, 300° C.

Figure 4A:
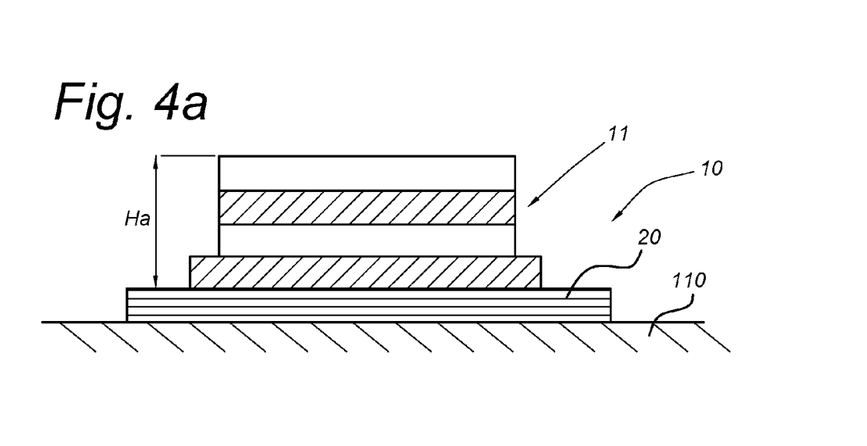
FIGS. 4a, 4b and 4c show semiconductor dies including a carrier, a top surface of the semiconductor die being tilted (FIGS. 4b and 4c) or not (FIG. 4a)
Figure 4B:
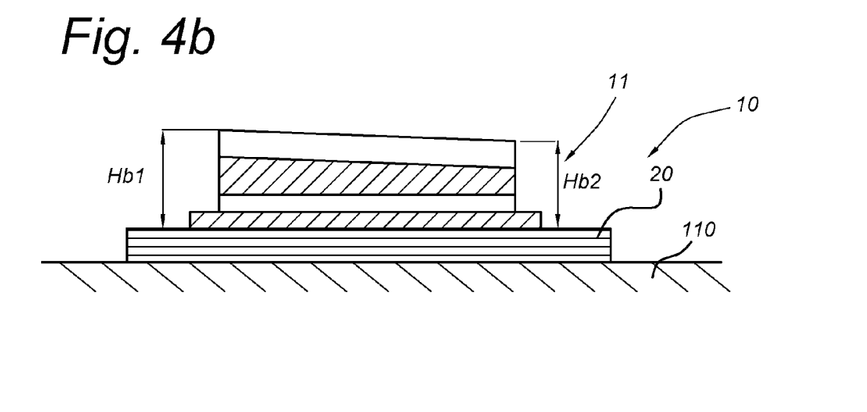
Figure 4C:
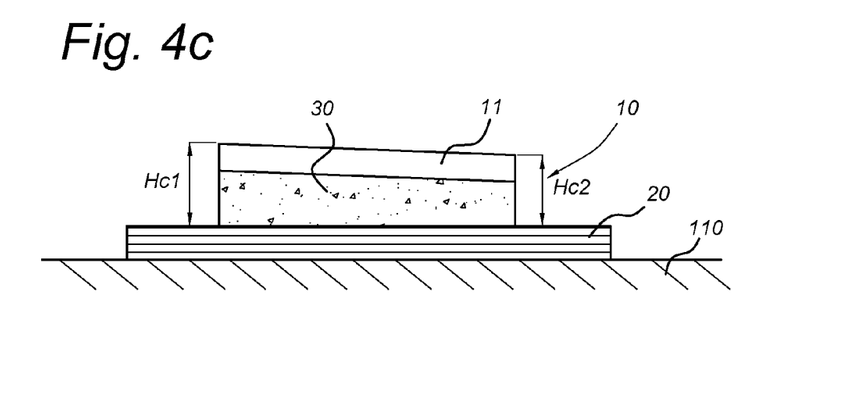

FIGS. 4a, 4b and 4c show various configurations of a semiconductor product 10 including a carrier 20 which may occur in practice. FIG. 4a shows a more or less ideal situation in which a top surface of the die 11 comprised in the semiconductor product is parallel to its bottom surface so that the top surface is also parallel to the contact surface of the first tool member 110. The height Ha of the semiconductor die top surface is at a specified level above the contact surface of the first tool member. FIG. 4b shows the configuration of another but comparable semiconductor product. Its top surface is tilted, and both its height Hb1 at the high side and its height Hb2 at the low side are not equal to the reference height Ha. FIG. 4c shows the configuration of another die 11 that is to be bonded by a bonding material 30 to a substrate 20. Since the bonding material has not been provided equally, the top surface of the semiconductor product 10 is not parallel to the contact surface of the first tool part 110, and both heights Hc1 and Hc2 are not equal to a reference height Ha. The insert member 200 will adapt to the configurations shown in FIGS. 4a, 4b and 4c to apply a uniform predetermined pressure onto the top surface of the semiconductor product. Height and tilt tolerances in the order of 100 micrometer of the semiconductor product are allowable.

Figure 5:
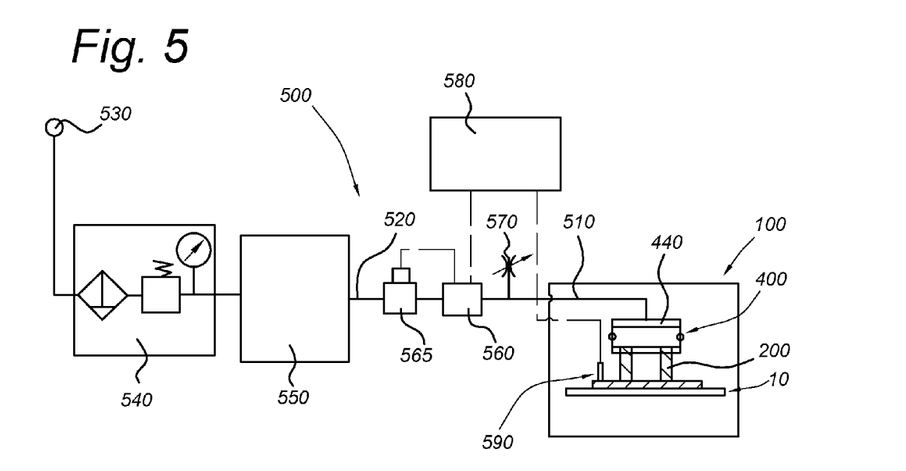
FIG. 5 shows a schematic view of a fluid flow arrangement for applying pressure to the insert member.

A schematic representation of the fluid flow arrangement 500 is shown in FIG. 5. A factory air supply is supplied to a factory air regulator 540 and subsequently brought to a higher pressure by a booster 550 to, for instance, about eighteen times the factory air pressure. The fluid (air) is then passed through fluid channel 520 to a main valve 565 and a PID pressure controller 560, which controls the main valve 560. A compound pressure sensor 590 is provided within the space in between first and second mould parts to monitor a pressure of the encapsulate or compound material within the space. A signal of the pressure sensor 590 is passed to a system controller 580. The system controller 580 provides a setpoint for the fluid (air) pressure within the fluid channel 510 and fluid chamber 440 to the PID pressure controller 560.

The pressure within the fluid channel 510 and fluid chamber 440 is monitored by the PID pressure controller 560 (which comprises a pressure sensor) and also passed back to the system controller. The system controller 580 is further employed to set the proportional, integration and differentiation parameters of the PID pressure controller 560, which are used to regulate the main valve 565 for setting a flow rate of fluid. Some fluid is allowed to escape from fluid channel 510 through adjustable needle valve 570, which allows a pressure within fluid chamber 440 to be set to decrease since fluid can escape from the fluid chamber.

The fluid pressure within the fluid chamber 440 determines the force exerted by the insert member 200. The force exerted by the insert member is proportional to the pressure within the fluid chamber 440. Monitoring the pressure within the fluid chamber 440 is therefore also monitoring the force exerted by the insert member and therefore the pressure exerted on the semiconductor product. The PID pressure controller 560 is therefore just as well a PID force controller for controlling the force exerted by the insert 200 under PID control. The pressure within the fluid chamber, and thus the force exerted by the displaceable insert, is monitored and regulated real time at a suitable bandwidth, which can be in the order of a few hundred hertz, for instance, 200 Hz but also at a lower or higher bandwidth, if desired.

Figure 6A:
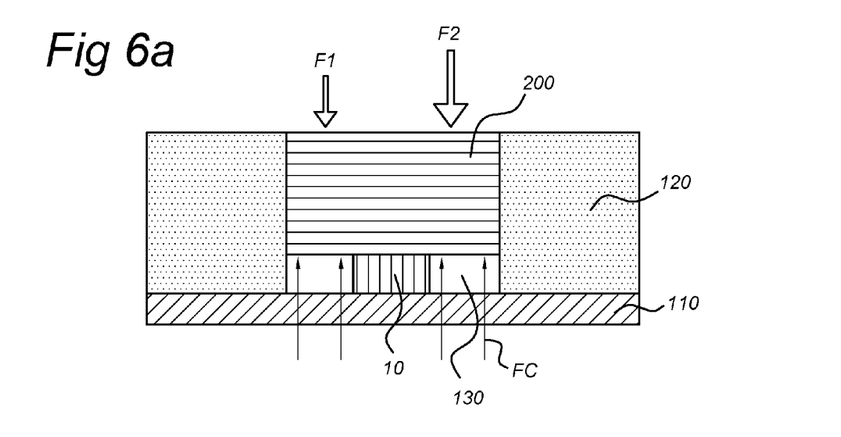
FIGS. 6a, 6b and 6c show application examples of a semiconductor die encapsulation method.

An application example is shown in FIG. 6a. A semiconductor product 10 comprising a die is provided on a first mould part 110 and an insert 200 exerts a force F1 on the semiconductor product, which yields a pressure exerted on the semiconductor product. The space 130 between first and second mould parts 110, 120 and the insert 200 is subsequently filled with a liquid encapsulation or compound material (not shown). The encapsulation material is generally provided as pills that are being melted before introduction into the space 130. A predetermined pressure provided by force F1 is required to keep to top side of the die of product 10 open and clean. During filling of the space 130 with compound material an increasing pressure resulting in a compound force FC will be exerted by the compound on the insert 200, which counteracts the force F1. An additional force F2 is therefore to be exerted by the insert to have a constant pressure exerted on the product 10. Also during hardening of the compound (encapsulation) material the compound pressure will generally change. The pressure of the compound is therefore measured by a compound pressure sensor 590 (not shown in FIG. 6a but in FIG. 5) and passed to system controller 580 to provide an adjusted setpoint pressure to PID pressure controller 560. The pressure in the space by pressure sensor 590 is also monitored real time at a bandwidth comparable to the bandwidth at which the pressure within the fluid chamber 440 is measured. A force exerted by the insert 200 on the die of semiconductor product is set such that a pressure exerted by the insert onto the product is in excess of the compound pressure in the space, for example, 1-20% in excess of the compound pressure in the space.

Figure 6B:
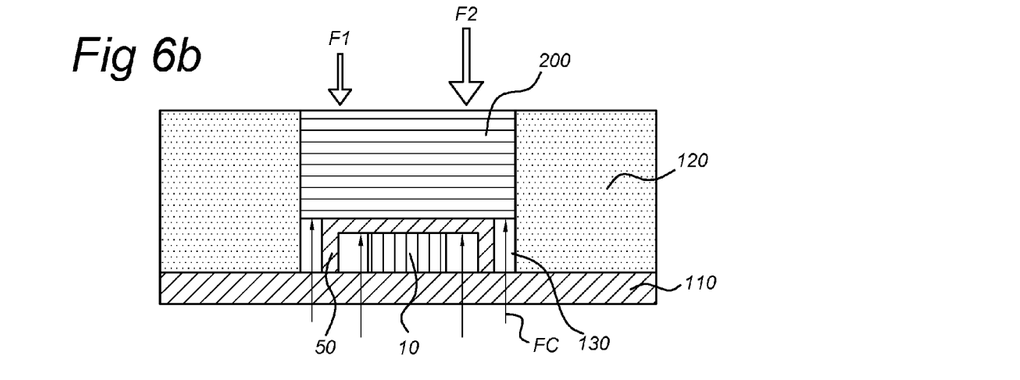

Another application example is shown in FIG. 6b. A semiconductor product 10 comprising a power IC mounted on a heat sink 50 is provided on first mould part 110 within in the space 130. The insert 200 is to exert a predetermined pressure (which is provided by force F1 in absence of compound material) on the product 10 having the heat sink 50. To counteract the effects of a pressure by compound material filling the space 130 an additional force F2 by the insert is required, which is again effected by regulating the pressure of the fluid within the expandable arrangement 400.

Figure 6C:
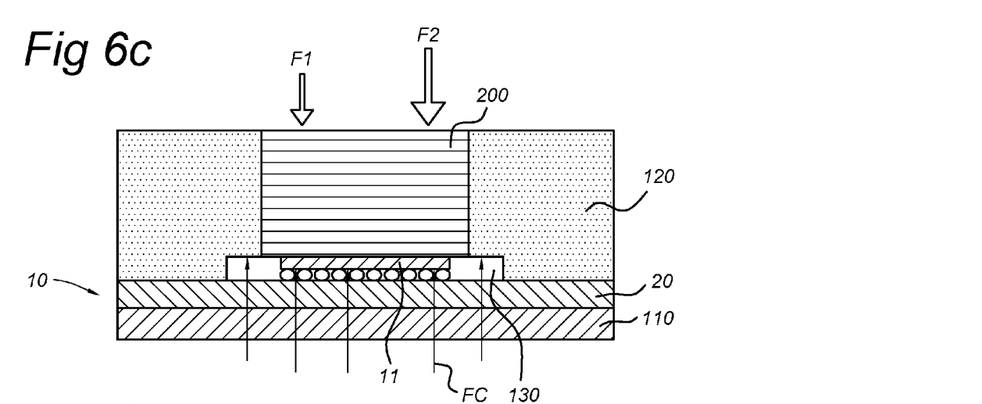

FIG. 6c shows a semiconductor product comprising a sensor die 11 bonded by a bonding material to a carrier 20. The product is again provided on first mould part 110 and an insert 200 exerts a pressure onto the product during the encapsulation process. The bonding material provides open spaces in which compound material can enter. The compound will in this example provide a compound pressure that is counteracted by a force F2 in addition to a force F1 by the insert to provide a constant nett pressure exerted by the insert on the die of semiconductor product 10.

Figure 7:
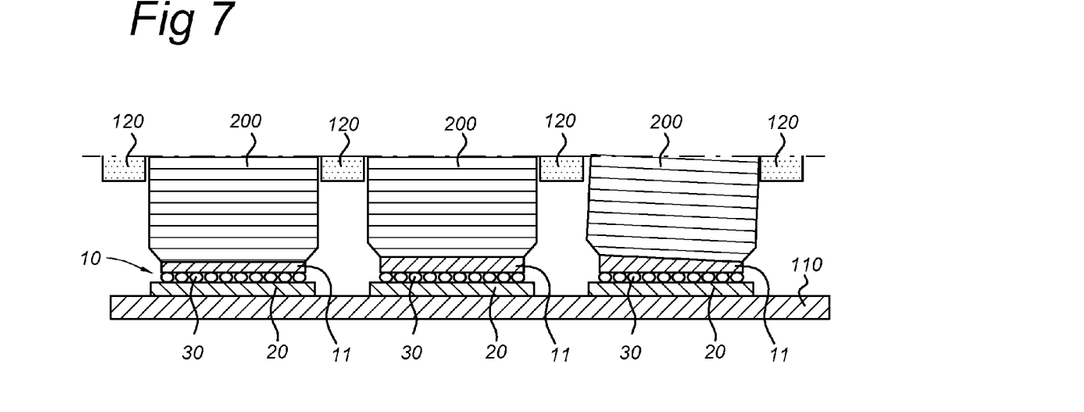
FIG. 7 shows a two-part tool for a carrier-bonding method with multiple semiconductor dies in between both tool parts.

FIG. 7 shows a two-part tool for mounting a die 11 on a carrier 20, such as a lead frame, using a bonding material 30. This will yield another semiconductor product that may be encapsulated (packaged) in a method and apparatus as disclosed above. The bonding process can be a sintering process in which a sintering paste is provided in between the carrier 20 and the die 11. The sintering paste may comprise pure silver (Ag) particles that will convert to a pure Ag layer when heated to a predetermined temperature under a predetermined pressure during a predetermined time interval. A porous structure of interconnected Ag particles will result, which is also interconnected to the die of semiconductor product and the substrate. In general the sintering paste may comprise other conductors, such as another metal like copper (Cu). The bonding material can be provided across a large area or even the whole area of the surface of the die facing the substrate or to selective areas for, for instance, providing (local) electrical and/or thermal conductivity. In the bonding or sintering process the pressure applied by an insert member can be made dependent on the temperature of the die or semiconductor product on which a force is exerted by the displaceable insert member. One can set for instance a pressure profile dependent on the temperature of the semiconductor product or die, for instance, having a maximum set pressure applied before a temperature of the dies has reached 130° C.

To provide the predetermined pressure the semiconductor product comprising die, substrate and bonding material is provided on a first tool part 110. A second tool part 120 having a displaceable insert 200 is provided over the first tool part. The insert 200 is then forced against the die at the predetermined pressure in an equivalent manner as has been disclosed above for the encapsulation method. During heating of the sintering paste, the pressure exerted by the insert is being monitored and adjusted as required. The pressure by the insert is generally in the range of 1-150 bar, for instance, 40 bar as would be required by the specific application. It is shown in FIG. 7 that multiple semiconductor products with dies are provided in the space between the first and second tool parts 110, 120 for being processed in a batch. Each semiconductor product has a single associated insert. The pressure exerted by each insert is collectively maintained and monitored. Each insert adjusts itself to the height and tilt of the semiconductor die it is associated with as has been disclosed above with reference to FIGS. 1 to 6. The three example semiconductor products with dies all show a different height and tilt. Differences in height and/or tilt in the order of magnitude of 100 micrometer, such as, for instance, 400 micrometer, can be accommodated.

Figure 8A:
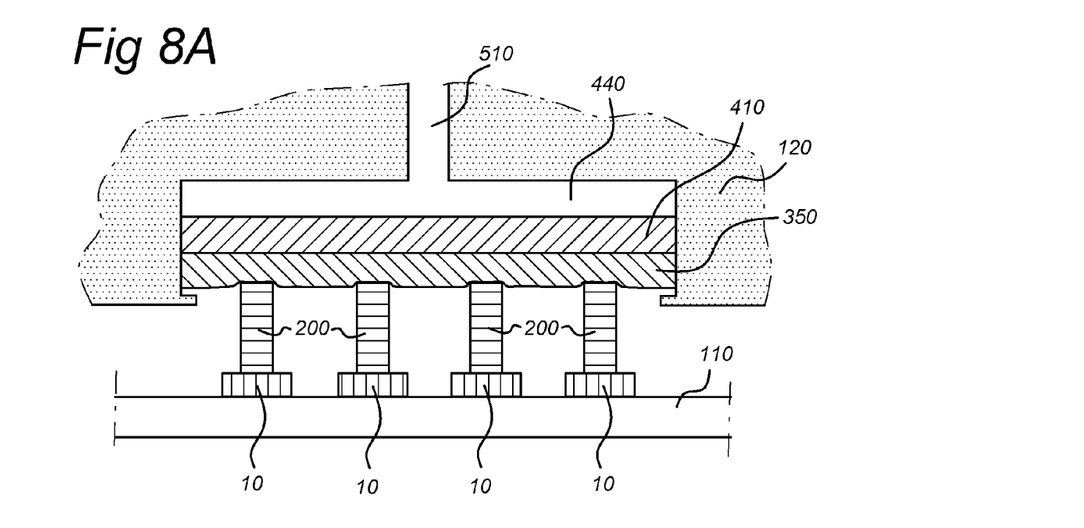
FIGS. 8a and 8b shows schematic views of other embodiments according to the invention.
Figure 8B:
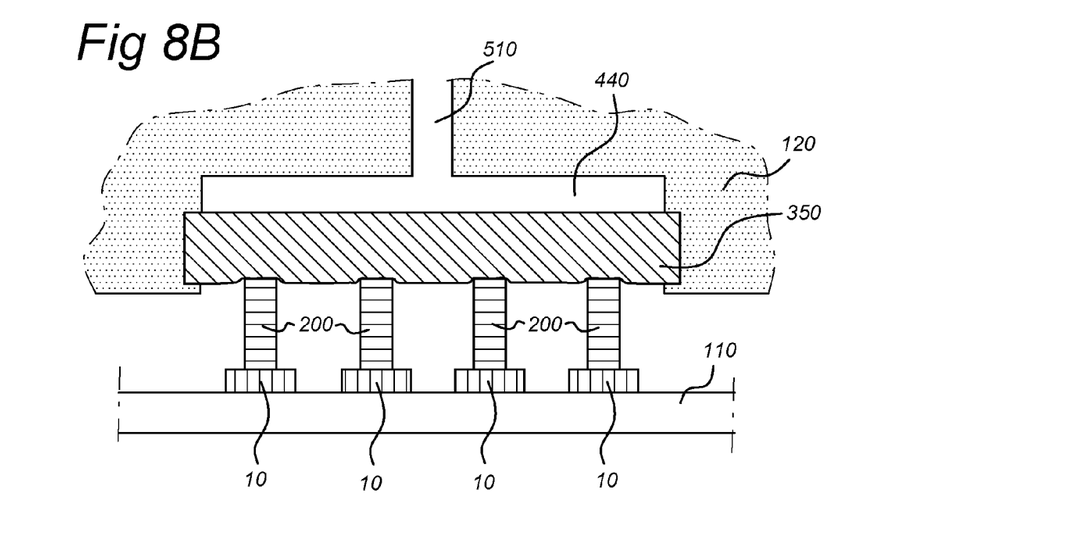

Another embodiment is schematically shown in FIG. 8a. The figure shows multiple semiconductor products 10 with dies arranged on first tool part 110. Each semiconductor product has an associated displaceable insert 200. Only one insert is shown per semiconductor product, whereas more than one insert per product might be employed. A force is applied onto the inserts 200 by a piston-like element 410 as has been disclosed in earlier embodiments. A flexible and/or deformable member 350, such as a deformable sheet of silicone material, is arranged in between the piston-like element 410 and multiple displaceable inserts 200. The configuration may also be such that the pressure in the fluid chamber acts directly on a flexible/deformable member 350 without being mounted on a piston-like element. The deformable/flexible member as such may then acts as the piston-like element. In another configuration the flexible/deformable member 350 is arranged as a membrane of which the outer circumference is (directly or indirectly) attached to the second tool part (120), as shown in FIG. 8b. The flexible and/or deformable member allows each insert to adjust to the individual heights and tilts of the associated dies of semiconductor products such that substantially an equal force and even pressure is applied by each insert on its associated product. The individual inserts 200 in combination with the flexible/deformable member 350 of the expandable arrangement allow adjusting to height and tilt variations of the individual semiconductor products. FIGS. 8a and 8b show the flexible/deformable member having dents as a result of force exerted on the inserts. The inserts 200 are attached to the flexible/deformable member 350 and the flexible/deformable member is attached to the piston 410 in a manner not shown in the figures but known as such.

Figure 9A:
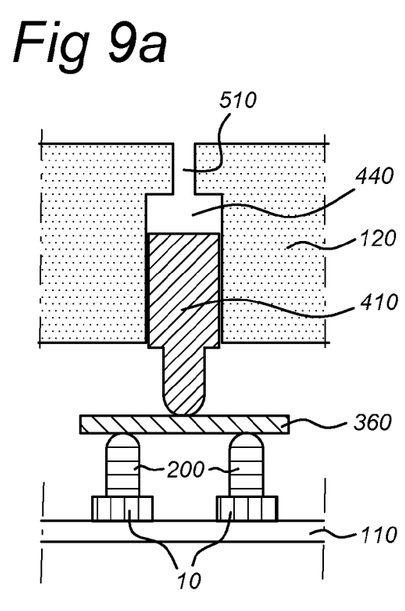
FIGS. 9a and 9b show schematic views from the side and top, respectively, of yet another embodiment according to the invention.
Figure 9B:
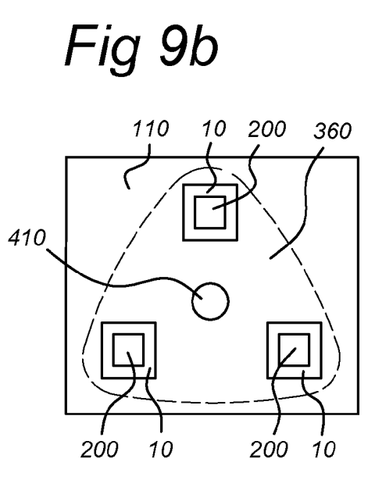

Yet another embodiment is schematically shown in FIGS. 9a and 9b. The figures show semiconductor products 10 with dies on a first tool part 110, each product having an associated expandable insert 200. The inserts are coupled to a plate 360 such can tilt with respect to the inserts. The inserts therefore have a rounded top, but such tilting can also be achieved in another manner. The plate 360 is further coupled to a piston 410. The coupling to the piston is also such that the plate 360 can tilt with respect to the piston. In an actual embodiment this can be achieved in a manner comparable as shown in FIGS. 2a, 2b and 3. In such actual embodiment plate 360 (and inserts 200) would be enclosed in second tool part 120 comparable to intermediate member 300. The piston is coupled to the plate in a central position. The couplings of inserts and piston to the plate are not shown but are known as such. By the configuration of the coupling of plate 360 to inserts and piston, the plate will in use tilt such as to adapt to height variations of the semiconductor products and to exert a substantially equal force on each semiconductor product. The coupling of inserts to the plate further allows in use tilting of the inserts to adapt to tilt variations in the semiconductor products.

Embodiments have been disclosed in which the first tool part is the bottom tool part on which semiconductor dies or semiconductor products comprising semiconductor dies are arranged, and in which the second tool part is the upper tool part having the displaceable insert members. However, the first tool part on which the dies are provided may also be the upper tool part, while the lower tool part is the second tool part having the displaceable insert members. In yet other embodiments the first tool part both comprises the displaceable insert members and is constructed to hold the (semi-conductor products with) semiconductor dies. Generally, the first tool part will be the bottom tool part in such embodiments, in which the dies are provided arranged on a carrier facing downwards. The second tool part is then a closing tool part such as to provide the space in which the dies are arranged when both tool parts have been brought together. Various other embodiments of the invention will be apparent to the skilled person when having read the above disclosure in connection with the drawing, all of which are within the scope of the invention and accompanying claims.

The invention claimed is:

1. A semiconductor die encapsulation or carrier-mounting method comprising the steps of:
providing a first tool part constructed and arranged for holding multiple semiconductor dies at positions associated with the first tool part;
providing semiconductor dies to said positions associated with the first tool part;
providing a second tool part, one of the first and second tool parts comprising displaceable insert members constructed and arranged to allow applying a pressure by each displaceable insert member onto a surface area of a semiconductor die provided on the first tool part, each of said positions associated with the first tool part being associated with one or more displaceable insert members;
bringing together the first and second tool parts to define a space between the first and second tool parts, the semiconductor dies being arranged in the space;
having the displaceable insert member apply a force onto said surface area of the semiconductor die;
monitoring the force applied by each displaceable insert member;
regulating the force applied by each displaceable insert member to a predetermined force;
separating the first and second tool parts; and
removing the processed semiconductor dies.

2. The method according claim 1, wherein the force applied by each displaceable insert member is regulated under PID control provided with a set point for the predetermined force.

3. The method according to claim 1, wherein the force applied by each displaceable insert member is provided by fluid pressure in an expandable arrangement acting on each displaceable insert member.

4. The method according to claim 3, wherein the same fluid pressure acts on each displaceable insert member.

5. The method according to claim 3, wherein the expandable arrangement comprises at least one of a piston, a bellows and a membrane.

6. The method according to claim 1, wherein a displaceable insert member is tilted such that a contacting surface of the displaceable insert member is aligned parallel with a surface of the semiconductor die on which a force is to be exerted by the displaceable insert member.

7. The method according to claim 1, wherein the method further comprises the step of providing a plastic film in between semiconductor dies and displaceable insert members.

8. The method according to claim 3, wherein a deformable member of the expandable arrangement acts on at least one displaceable insert member.

9. The method according to claim 8, wherein the deformable member comprises a flexible material.

10. The method according to claim 3, wherein a plate of the expandable arrangement acts and exerts a substantially equal force on two or three displaceable insert members by tilting around a central point.

11. The semiconductor die encapsulation method according to claim 1, further comprising the steps of:
introducing an encapsulation material in a liquid state into the space after having the displaceable insert members apply a force onto said surface area of the semiconductor dies;
monitoring a pressure in the space;
regulating the force applied by the displaceable insert members to the predetermined force that is dependent on the pressure in the space; and
letting the encapsulation material solidify from the liquid state into a solid state.

12. The semiconductor die carrier-mounting method according to claim 1, further comprising the steps of:
providing the semiconductor dies onto a carrier with a bonding material in between the carrier and the semiconductor dies;
providing the carrier with the semiconductor dies onto the first tool part in the step of providing the semiconductor dies on the first tool part; and
allowing the bonding material to cure while regulating the force applied by the displaceable insert members to the predetermined force.

13. A semiconductor product manufactured using the semiconductor die encapsulation or carrier-mounting method according to claim 1.

14. A semiconductor die encapsulation or carrier-mounting apparatus, comprising:
a first tool part constructed and arranged for holding multiple semiconductor dies at positions associated with the first tool part;
a second tool part, the first and second tool parts being arranged such as to allow the first and second tool parts to be brought together so as to define a space between the first and second tool parts, the semiconductor dies being arranged in the space when held on the first tool part, and one of the first and second tool parts comprising displaceable insert members constructed and arranged to allow applying a force by each displaceable insert member onto a surface area of each semiconductor die provided on the first tool part, each of said positions associated with the first tool part being associated with one or more displaceable insert members;
an insert member force monitoring arrangement constructed and arranged for monitoring the force applied by each displaceable insert member; and a regulating arrangement constructed and arranged for regulating the force applied by each displaceable insert member to a predetermined force.

15. The semiconductor die encapsulation apparatus according to claim 14, further comprising:
a filling arrangement constructed and arranged for introducing an encapsulating material in a liquid state into the space; and
a space pressure monitoring arrangement constructed and arranged for monitoring the pressure in the space.

16. The apparatus according to claim 14, wherein the apparatus comprises a force controller configured to regulate the force applied by the displaceable insert member under PID control provided with a set point for the predetermined force.

17. The apparatus according to claim 14, wherein the apparatus comprises an expandable arrangement acting on the displaceable insert members, and a fluid flow arrangement configured for providing a fluid pressure in the expandable arrangement such as to provide the force applied by the displaceable insert member.

18. The apparatus according to claim 17, wherein the expandable arrangement comprises at least one of a piston, a bellows and a membrane.

19. The apparatus according to claim 14, wherein the displaceable insert members are constructed and arranged to be tiltable such that a contacting surface of each displaceable insert member is aligned parallel with a surface of the semiconductor die on which a pressure is exerted by the displaceable insert member.

20. The apparatus according to claim 17, wherein the expandable arrangement comprises a deformable member constructed and arranged to act on at least one displaceable insert member.

21. The apparatus according to claim 20, wherein the deformable member comprises a flexible material.

22. The apparatus according to claim 17, wherein the expandable arrangement comprises a plate constructed and arranged to act on two or three displaceable insert members, and the plate being tiltable around a central point to apply a substantially equal force on each insert member.

23. The apparatus according to claim 21, wherein the flexible material is a silicone material.

* * * * *